United States Patent [19]

Ishida et al.

[11] Patent Number: 5,604,143
[45] Date of Patent: Feb. 18, 1997

[54] METHOD FOR PRODUCING NONVOLATILE MEMORY USED AS READ-ONLY STORAGE MEDIA

[75] Inventors: Shoji Ishida, Okazaki; Kenji Nakano, Toyota; Motofumi Kashiwaya, Toyota; Masataka Inoue, Toyota, all of Japan

[73] Assignee: Toyota Jidosha Kabushiki Kaisha, Toyota, Japan

[21] Appl. No.: 552,112

[22] Filed: Nov. 2, 1995

[30] Foreign Application Priority Data

Nov. 4, 1994 [JP] Japan .................................... 6-271487

[51] Int. Cl.[6] .......................................... H01L 21/8246
[52] U.S. Cl. ........................ 437/48; 437/34; 437/935
[58] Field of Search ........................ 437/34, 45, 48, 437/57, 935

[56] References Cited

U.S. PATENT DOCUMENTS

| | | | |
|---|---|---|---|
| 4,176,442 | 12/1979 | Bischoff et al. | 437/48 |
| 5,091,329 | 2/1992 | Bekkering et al. | 437/48 |
| 5,262,342 | 11/1993 | Toyama et al. | 437/48 |
| 5,279,982 | 1/1994 | Crotti | 437/48 |

FOREIGN PATENT DOCUMENTS

| | | |
|---|---|---|
| 52-046055 | 11/1977 | Japan . |
| 2-090608 | 3/1990 | Japan . |
| 3-108712 | 5/1991 | Japan . |

*Primary Examiner*—Chandra Chaudhari
*Attorney, Agent, or Firm*—Cushman Darby & Cushman IP Group of Pillsbury Madison & Sutro LLP

[57] ABSTRACT

A nonvolatile memory producing apparatus has a data computing section 31, an electron patterning section 33 for patterning a wafer 3 by using an electron beam, a control section 32 for controlling +the electron patterning section 33 on the basis of the result from the data computing section 31. The data computing section 31 prepares binary codes for individual IC chips formed on the wafer 3, and generates coordinate regarding the wafer 3 and the IC chips. The data computing section 31 computes direct draw data for each IC chip based on the binary codes, and generates direct pattern data based on the binary codes and the direct draw data. The control section 32 and the electron-beam patterning section 33 cooperate to perform direct electron-beam patterning on the IC chips in accordance with the pattern data.

11 Claims, 13 Drawing Sheets

1ST 2ND 3RD 4TH 5TH 6TH 7TH ~ nTH BIT (a) FORM ACTIVE REGIONS
(b) FORM GATE, SOURCE, DRAIN
(c) FORM LAYER INSULATORS
(d) FORM CONTACT HALLS
(e) FORM ALUMINIUM WIRING
(f) DISCONNECT ALUMINIUM WIRING
(g) FORM PASSIVATION LAYER
(h) FORM BONDING PAD

```
     55        56
   ┌──┐     ┌────┐
   #BLKN EBBLOCK
    * 1020 、 226 、 1
    └┘ └──┘   └─┘   └┘
    57   58    59   60

#BLKN EBBLOCK
    * 1030 、 236 、 1

#BLKN EBBLOCK
    * 1040 、 236 、 1
              ⟨
```

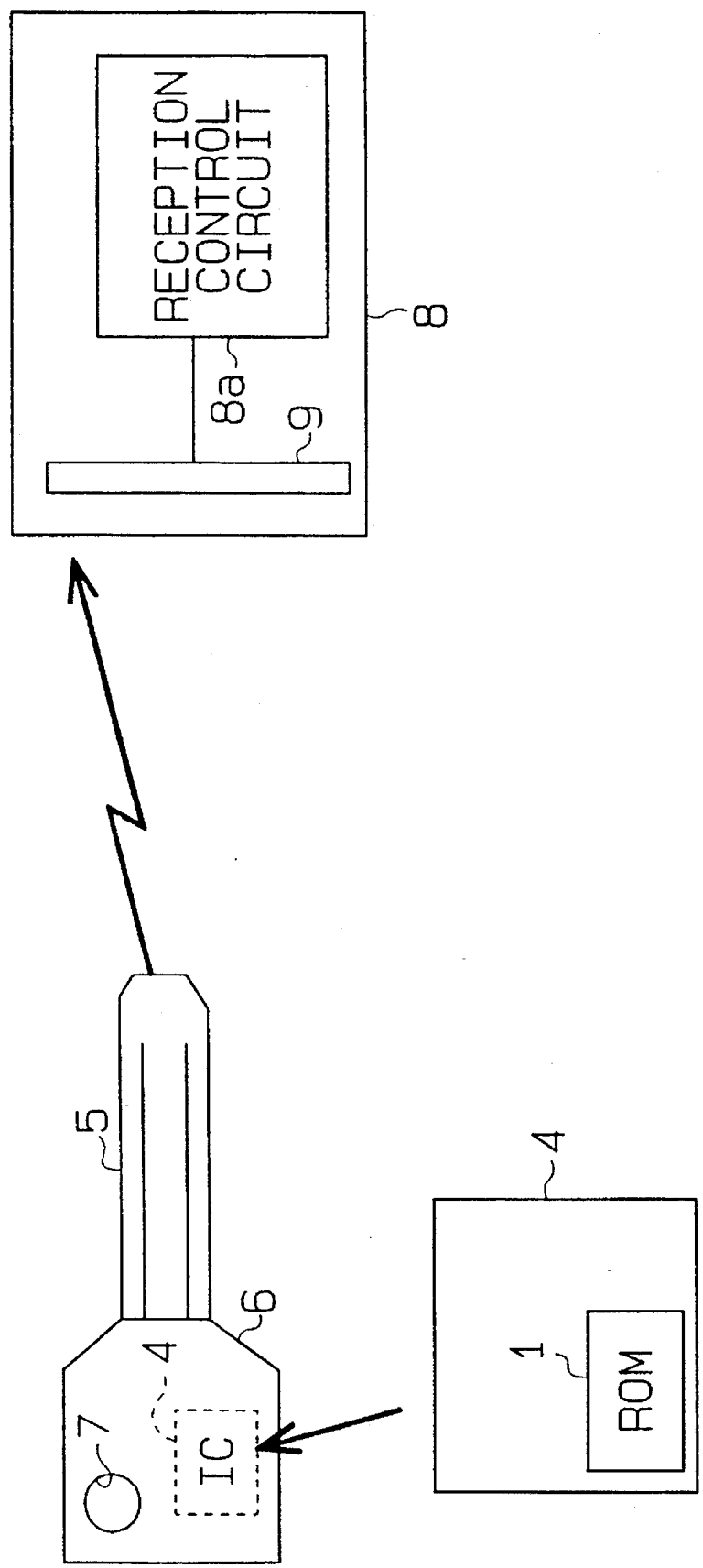

METHOD FOR PRODUCING NONVOLATILE MEMORY USED AS READ-ONLY STORAGE MEDIA

BACKGROUND OF THE INVENTION

1. Field of the Invention

The present invention relates to apparatus and method for producing nonvolatile memories used as read-only storage media.

2. Description of the Related Art

Wireless door lock systems Where a door lock can be operated by remote control have been widely used in, for example, motor vehicles. A vehicle wireless door lock system is essentially composed of a key unit and a vehicle unit. The key unit comprises a code memory that stores code data (key codes) constituted by, for example, binary codes, and a transmitter for transmitting code data. The vehicle unit comprises a receiver for receiving the code data from the transmitter, and a drive device for operating a door lock in accordance with the code data received.

By operating the key unit, code data is read from the code memory and then transmitted by the transmitter. The code data is then received by the receiver of the vehicle unit which causes the drive unit of the vehicle unit to operate a door lock in accordance with the code data received.

It is desirable that the code data for one wireless door lock system be different from the code data for another system. In other words, the code memory of each wireless door lock system should store code data specifically assigned thereto.

The storage media normally used as the code memory that stores the forgoing binary data are PROMs (programmable read only memory) or mask ROMs (read only memory). One problem with mask ROMs is that they do not provide for a wide variety of binary code assignment. Namely, in the manufacturing of mask ROMs, a single reticle used in the mask formation step by a step repeater (or stepper) can contain only a few more than a dozen chip patterns. Hence, only a few more than a dozen binary codes can be assigned to the chips on a single wafer. Thus, different binary codes can be assigned to mask ROMs only on a group basis, not on an individual basis. In other words, use of mask ROMs does not allow for specific key code assignment to individual vehicles.

On the other hand, PROMs enable such individually specific key code assignment and therefore are often used as the storage media for the code memory. However, one problem with using PROMs is that the production process required for PROMs is about 1.5 times as long as that required for mask ROMs, resulting in increased production costs and slow delivery. Another problem with using PROMs is that the service life of PROMs is limited due to their relatively poor charge retaining characteristics. Hence, PROMs may suffer depletion or mutation of the written data over long period use.

Thus, there is a need for a storage medium that provides individual code assignment without substantially complicating the production process.

SUMMARY OF THE INVENTION

Accordingly, it is a primary objective of the present invention to provide nonvolatile memory producing apparatus and method that produce ROMs by directly writing information in the IC chips on a wafer without using a mask for ROMs. The ROMs produced by the invention are particularly suited for use with a wireless door lock system because individual code assignment is obtained without substantially complicating the production process.

According to an aspect of the present invention, there is provided a nonvolatile memory producing apparatus that forms an array of chips on individual wafer, converts binary codes to bit image data, and writes the binary code in the chips of each wafer based of the bit image data, the apparatus comprising binary code generating means, coordinates calculating means, data converting means, and electron patterning means. The binary code generating means generates binary codes to be written on each chip, wherein each binary code generated is different from all other binary codes generated for a given wafer. The coordinates calculating means calculates coordinates corresponding to positions of the chips of the each wafer. The data converting means converts the binary codes for the chips of each wafer to direct draw data that are used to directly write the binary codes on the chips of each wafer. The electron patterning means directly performs direct patterning to write the binary codes on the chips of each wafer on the basis of the coordinates calculated by the coordinates calculating means and the direct draw data provided by the data converting means.

According to another aspect of the invention, there is provided a nonvolatile memory producing apparatus that forms an array of chips on individual wafers, wherein each chip includes a plurality of memory cells for storing binary codes therein, converts binary codes to bit image data, and writes the binary code in the memory cells of each chip based on the bit image data, the apparatus comprising binary code generating means, coordinates calculating means, data converting means, pattern data calculating means, and electron patterning means. The binary code generating means generates binary codes to be written on the memory cells of each chip, wherein each binary code generated is different from all other binary codes generated for a given wafer. The coordinates calculating means calculates coordinates corresponding to positions of the memory cells of each chip on the given wafer. The data converting means converts the binary codes for the memory cells of each chip to direct draw data that are used to directly write the binary codes on the memory cells of each chip. The pattern data calculating means calculates direct pattern data based on the coordinates calculated by the coordinates calculating means and the direct draw data provided by the data converting means. The electron patterning means performs direct patterning to directly write the binary codes on the memory cells of each chip on the wafer on the basis the direct pattern data.

According to still another aspect of the present invention, there is provided a nonvolatile memory producing method that forms an array of chips on individual wafer, converts binary codes to bit image data, and writes the binary code on the chips of each wafer based on the bit image data, the method comprising steps as follows. In a binary code generating step, binary codes are generated to be written on each chip, wherein each binary code generated is different from all other binary codes generated for a given wafer. In a coordinates calculating step, coordinates corresponding to positions of the chips on each wafer are calculated. In a data converting step, the binary codes for the chips of each wafer are converted to direct draw data that are used to directly write the binary codes on the chips of each wafer. In an electron patterning step, direct patterning is performed to directly write the binary codes on the chips of each wafer on the basis of the coordinates calculated in the coordinates calculating step and the direct draw data provided in the data converting step.

Preferably, the direct patterning on the chips of each wafer is performed either by using an electron beam to disconnect a wiring line of a transistor or by ion implantation to converting an enhancement type MOS transistor to a depletion type.

BRIEF DESCRIPTION OF THE DRAWINGS

The invention, together with objects and advantages thereof, may best be understood by reference to the following description of the presently preferred embodiments together with the accompanying drawings in which:

FIG. 31 illustrates an example application of the memory produced by the apparatus of the invention.

DETAILED DESCRIPTION OF THE PREFERRED EMBODIMENTS

A first embodiment of the invention will be described hereinafter with reference to FIGS. 1–24.

First, a ROM (read only memory) circuit according to the first embodiment will be described with reference to FIG. 2.

The ROM has a memory array of CMOS devices. FIG. 2 illustrated a representative CMOS device as a read-out circuit (memory cell) 1 of the memory array. Each CMOS device is essentially composed of a p-n-p MOS transistor (hereinafter, referred to as "Tr0") and an n-p-n MOS transistor (hereinafter, referred to as "Tr1") that are connected in series. The drain of Tr0 is connected to an input of an inverter 2. The input to the inverter 2 is also provided with a parasitic capacitor (hereinafter, simply referred to as "capacitor") C.

Figure 2:
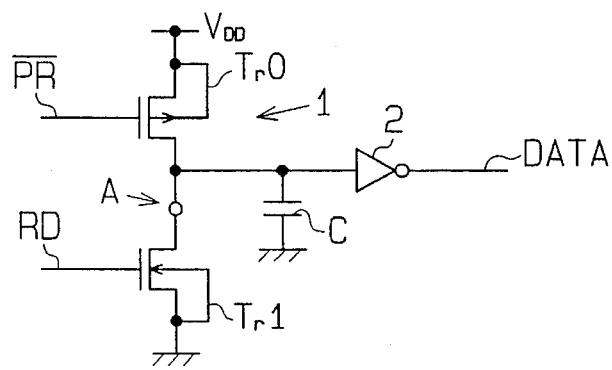
FIG. 2 is a circuit diagram of a CMOS.
Figure 3:
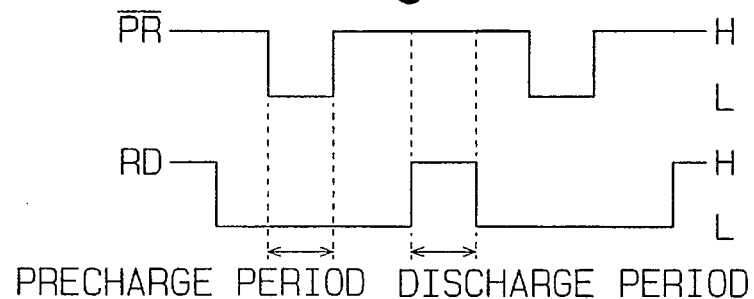
FIG. 3 is a timing chart of the CMOS.

To read out data, the read-out circuit 1 uses a two-phase clock achieved by PR line connected to the gate of Tr0 and RD line connected to the gate of Tr1 as shown in FIG. 3. Although in FIGS. 2, 3, 25 and 26, "PR" is topped with a bar to indicate inversion, the bar is omitted in the specification.

When the PR line is at logic low level, Tr0 turns on to precharge the capacitor C. When the RD line is at logic high level, Tr1 turns on to discharge the capacitor C. If a point A in this circuit 1 is electrically disconnected, the high level in the RD line does not cause the capacitor C to discharge but instead causes a low level signal (0 in binary) to be output to a DATA line connected to an output terminal of the inverter 2. If the point A is electrically connected, the high level in the RD line causes the capacitor C to discharge and causes a high level signal (1 in binary) to be output to the DATA line. The data output to the DATA line is latched at a rising edge on the RD line to read out the data.

The level (high or low) of data read out from the DATA line is determined by electric connection status of a line indicated by the point A in FIG. 2. That is, if the line is electrically connected, the data is at the low level, and if it is disconnected, the data is at the high level.

Figure 4:
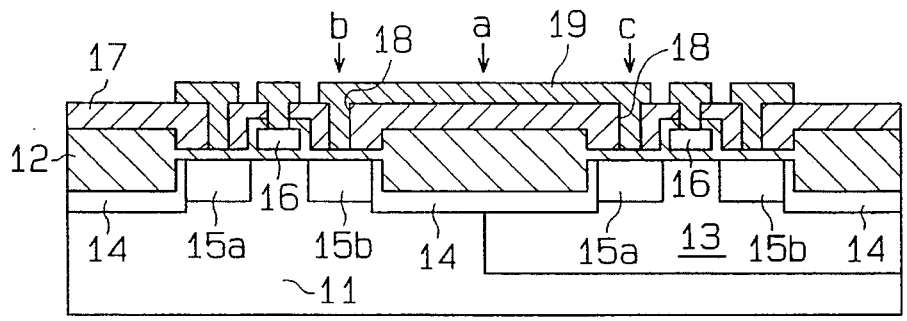
FIG. 4 is a sectional view of main portions of the CMOS.

The point A in FIG. 2 corresponds to an aluminum line indicated by an arrow a in the sectional view of a CMOS device in FIG. 4. The structure of the CMOS device is well known and will be only briefly described. The CMOS device comprises a silicon substrate 11, oxidized silicon layers 12, a P well 13, channel stoppers 14, sources 15a, drains 15b, gate electrodes 16, layer insulators 17 and an aluminum line 19.

Figure 5:
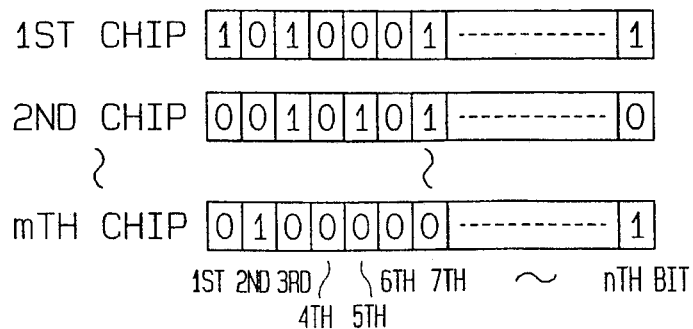
FIG. 5 illustrates binary codes of chips.
Figure 6A:
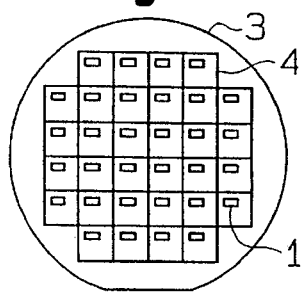
FIG. 6 illustrates a wafer and aluminum lines.
Figure 6B:
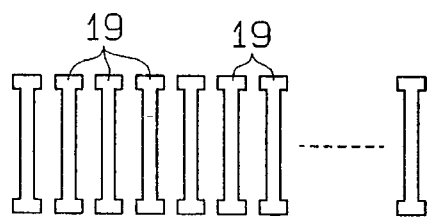
Figure 7A:
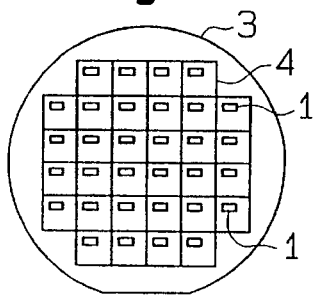
FIG. 7 illustrates a wafer and aluminum lines partially disconnected.
Figure 7B:
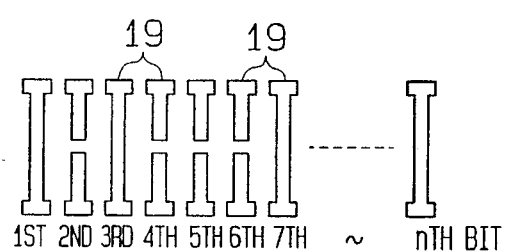

Code data achieved by n sets of circuits as shown in FIG. 2 is assigned to an IC chip in a manner as shown in FIGS. 5, 6 and 7.

As shown in FIGS. 6 and 7, a wafer 3 carries many IC chips (hereinafter, simply referred to as "chips") 4. Each chip 4 carries a ROM comprising a memory array of n CMOS devices. In FIG. 6, none of the n aluminum lines 19 connecting between the Tr1 and the Tr0 of the CMOS devices is disconnected. Thus, up to n bits can be stored in this ROM.

The aluminum lines corresponding to "0" bits of the n bit binary code are disconnected, and the aluminum lines corresponding to "1" bits are left connected, as shown in FIG. 7. In FIG. 7, aluminum lines 19 are disconnected according to the binary code for the first chip shown in FIG. 5.

Thus, a binary code of up to n bits can be assigned to a chip 4 having n CMOS devices by disconnecting the aluminum lines corresponding to "0" bits of the binary code and leaving the aluminum lines corresponding to "1" bits connected.

FIG. 31 illustrates a wireless door lock system that utilizes a ROM constructed and fabricated in accordance with the invention. The IC chip 4 and a battery (not shown) are contained in a casing 6 that is provided at a base end of a key 5. An operating button 7 is provided in the casing 6. When the operating button 7 is pressed, a transmitter circuit (not shown) in the IC chip 4 reads the key code from the ROM 1 and transmits a code signal based on the key code. A receiver 8 provided in a vehicle receives the code signal by an antenna 9. A reception control circuit 8a of the receiver 8 determines whether the received code signal is the code signal predetermined specifically to the system. If it is the predetermined code signal, the reception control circuit 8a causes a lock drive device (not shown) to operate a door lock (not shown). If it is not the predetermined code signal, the reception control circuit 8a does not operate to actuate.the lock drive device.

Figure 8:
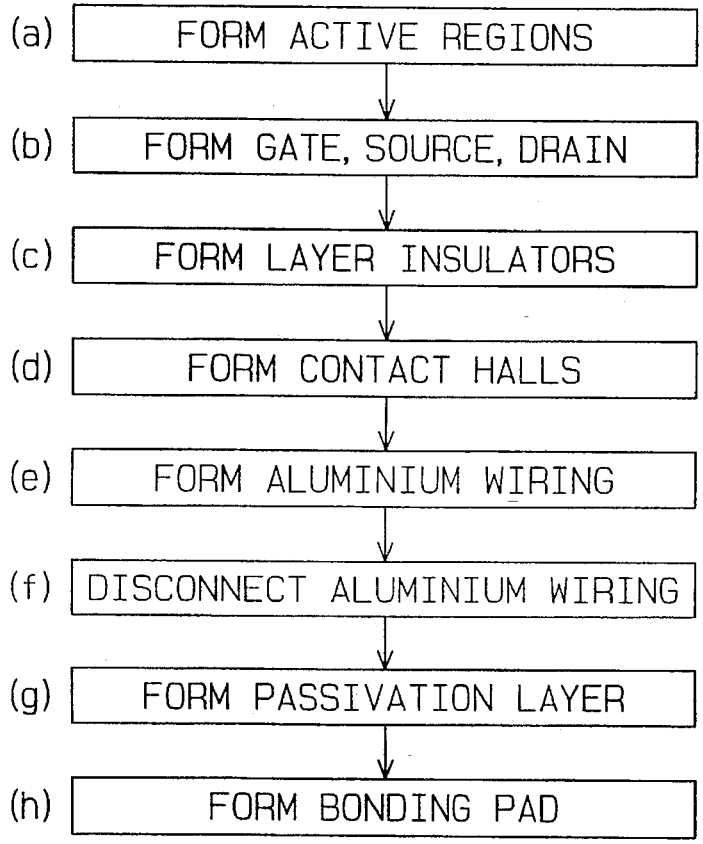
FIG. 8 is a process chart of the formation of CMOS.
Figure 9:
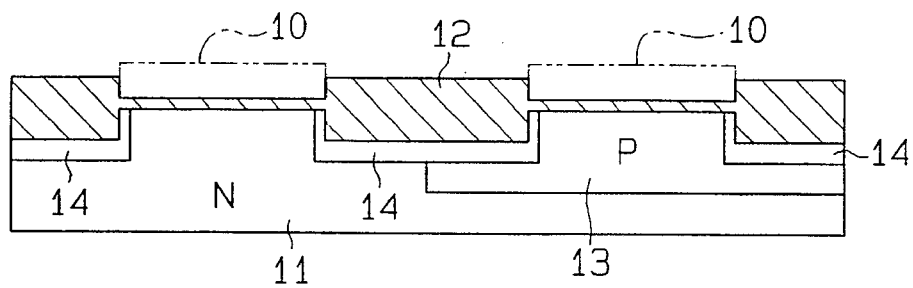
FIG. 9 is a sectional view of main portions of a wafer when active regions are formed.
Figure 10:
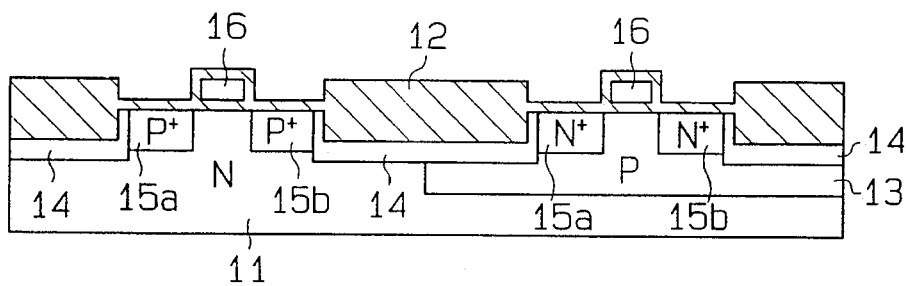
FIG. 10 is a sectional view of the wafer main portions when gate, drain and source regions are formed.
Figure 11:
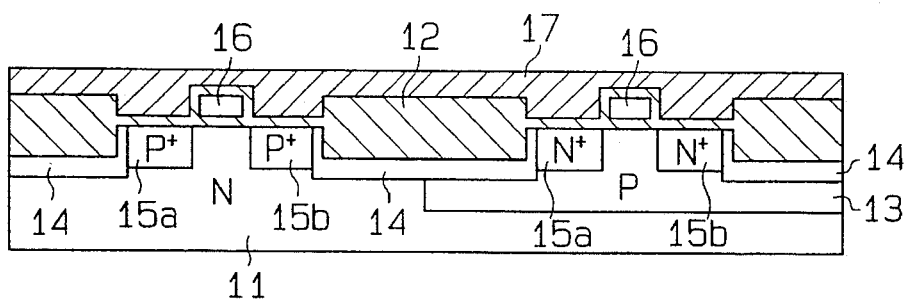
FIG. 11 is a sectional view of the wafer main portion when layer insulators are formed.
Figure 12:
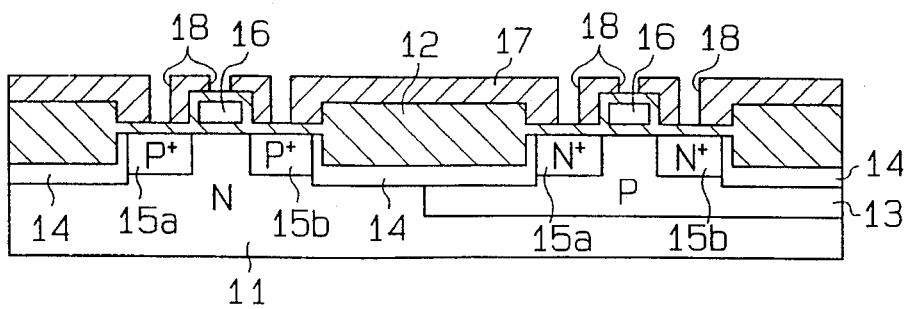
FIG. 12 is a sectional view of the wafer main portion when contact holes are formed.
Figure 13:
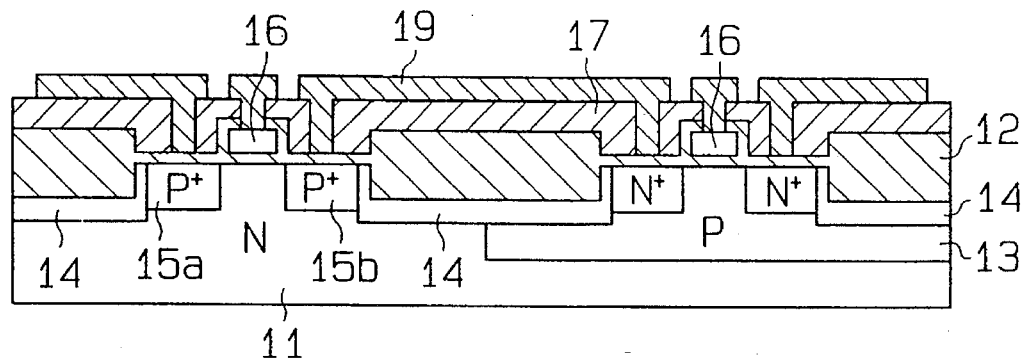
FIG. 13 is a sectional view of the wafer main portion when aluminum lines are formed.
Figure 14:
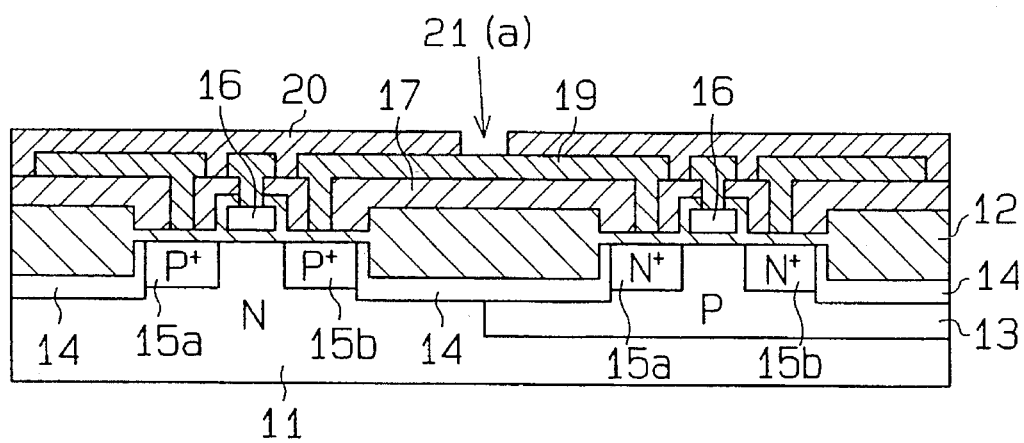
FIG. 14 is a sectional view of the wafer main portion when direct patterning is performed on ROM to fix resist.
Figure 15:
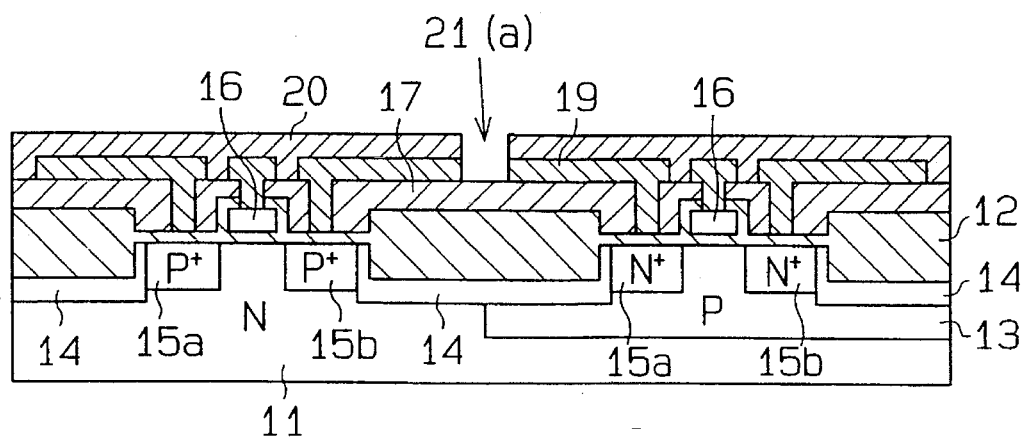
FIG. 15 is a sectional view of the Wafer main portion when etching is performed on ROM.
Figure 16:
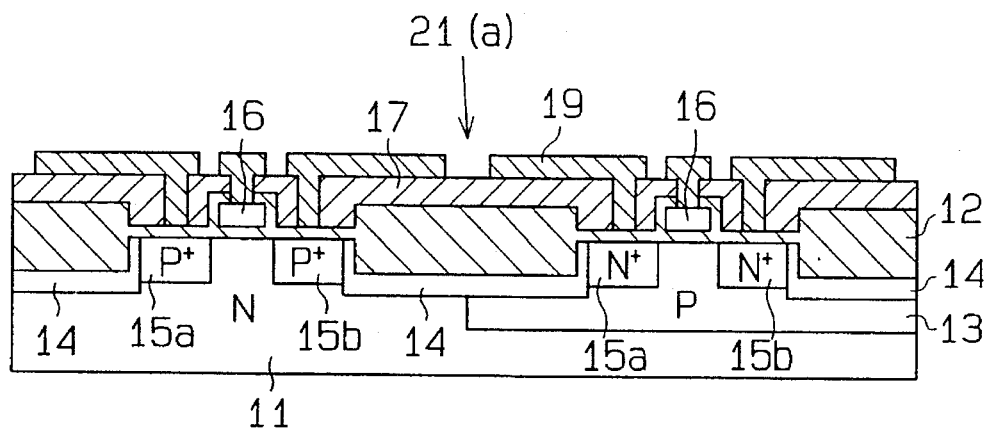
FIG. 16 is a sectional view of the wafer main portion when the resist is removed.
Figure 17:
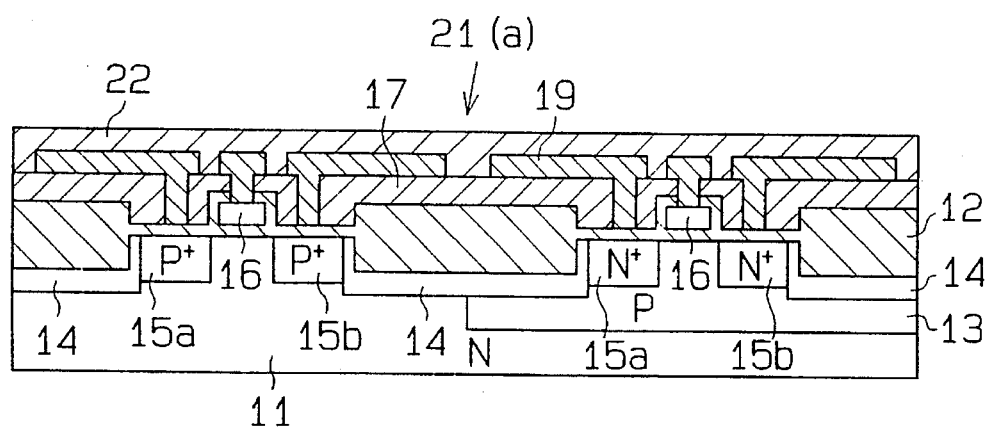
FIG. 17 is a sectional view of the wafer main portion when a passivating layer is formed.

A method for producing such CMOS devices will now be described with reference to FIGS. 8–18. FIG. 8 shows a flowchart of the CMOS production process. FIGS. 9–18 illustrate main portions of a CMOS device during CMOS production steps in accordance with the flowchart in FIG. 8. Each bit of the ROM is constituted by a CMOS device.

Referring to FIG. 8, since steps prior to the formation of active regions are well known, those prior steps are omitted from the flowchart. In the prior steps, the n-type silicon substrate 11 is provided with P wells 13 and with channel stoppers 14 around portions corresponding to active regions. The channel stoppers 14 are formed by ion implantation of boron (B). The step of forming active regions and subsequent steps will be described below with reference to the flowchart of FIG. 8.

In step (a) of FIG. 8 active regions are formed. In particular, device separation regions are provided by patterning of silicon nitride ($Si_3N_4$) layers 10. Using the nitride layers 10 as masks, thick oxide layers 12 are selectively formed at high temperature (see FIG. 9).

In step (b) of FIG. 8 gate, source and drains are formed. The mask nitride layers 10 and the underneath oxide layers 12 are removed by etching followed by formation of oxide ($SiO_2$) layers. Then, a polysilicon film is formed on the oxide layers by the CVD technique. Using the same method as used for the aforementioned device separation patterning, polysilicon gate electrodes 16 are formed (see FIG. 10).

Ion implantation is performed on the silicon substrate 11 to implant arsenic (As) into regions of the P wells 14 and boron (B) into the other regions, followed by thermal diffusion to form N+ regions and P+ regions. The sources 15a and the drains 15b are this formed.

In step (c) of FIG. 8 a layer of insulator is formed. In particular, a thick oxide layer 17 is formed on devices such as transistors by the CVD technique (see FIG. 11).

In step (d) of the FIG. 8 contact halls are formed. In particular, contact halls 18 for connecting devices to metal wiring are formed by using a resist.

In step of (e) of FIG. 8 aluminum wiring or lines are formed. An aluminum film is deposited on the entire surface of the wafer 3 by vacuum evaporation of aluminum. A photoresist of a desired pattern is formed on the aluminum film by photolithography. With the photoresist acting as a barrier, unnecessary portions (exposed portions) of the aluminum film are etched off to form aluminum lines 19 (see FIG. 13). Although not shown in FIG. 13, marking for precise positioning of an aluminum line disconnection pattern relative to the aluminum lines 19 is also formed.

In step (f) of FIG. 8 certain portions of the aluminum wiring or lines are removed or disconnected so as to set one or more binary codes in memory cells constructed from the active devices discussed above. An electron-beam resist 20 is applied and pre-baked. A desired pattern is drawn in the resist 20 by an electron-beam patterning section 33 of a nonvolatile memory producing apparatus 30 (see FIG. 1). Development and post-baking of the resist 20 are followed to produce an aluminum line disconnection pattern (see FIG. 14). With the aluminum line disconnection pattern of the resist 20 acting as a barrier, etching (either dry etching or wet etching) is performed to form disconnections 21 in the selected aluminum lines 19 (see FIG. 15). The resist 20 is then removed by, for example, ashing (see FIG. 16).

In step (g) of FIG. 8 a passivation layer is formed. Passivation is performed to form a nitride ($Si_3N_4$) layer (see FIG. 17).

Figure 18:
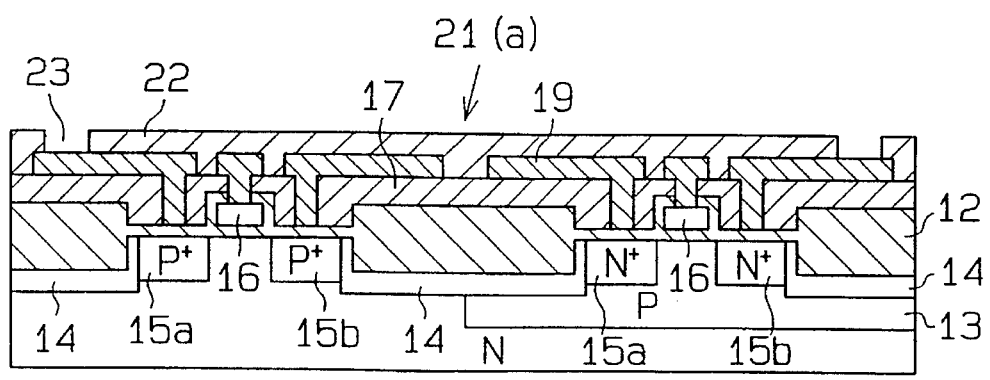
FIG. 18 is a sectional view of the wafer main portion when bonding pads are formed.

In step (h) of FIG.8 bonding pads are formed(see FIG. 18).

Through the processing outline in FIG.8 and discussed above, ROMs can be produced with each ROM having a binary code specifically assigned thereto.

A nonvolatile memory producing apparatus for use in producing the ROMs is described below. In particular, a nonvolatile memory producing apparatus 30 capable of directly drawing an aluminum line disconnection pattern on the wafer 3, will now be described with reference to FIGS. 1, 19 and 20.

Figure 1:
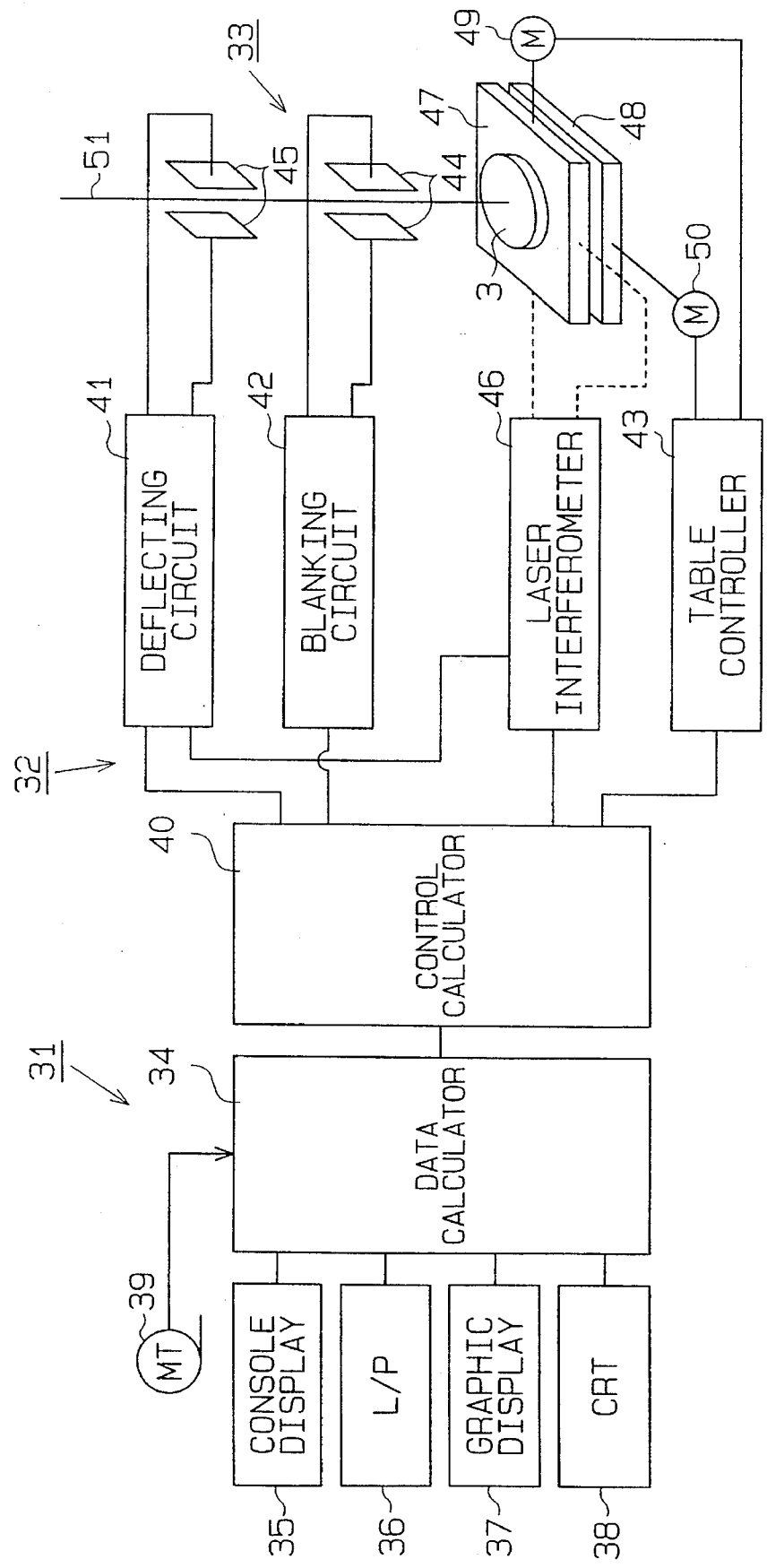
FIG. 1 is a schematic diagram of an embodiment of the nonvolatile memory producing apparatus of the present invention.

Referring to FIG. 1, the apparatus 30 comprises a data computing section 31 for computing data, an electron-beam patterning section 33 for forming a pattern on the wafer 3 by using an electron beam generated by an electron beam generator (not shown), and a control section 32 for controlling the electron-beam patterning section 33 on the basis of data from the data computing section 31.

Figures 23, 24:
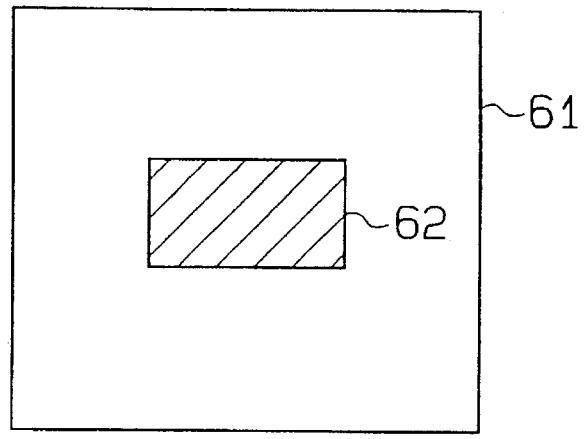
FIG. 23 illustrates an image of EBBLOCK data.
FIG. 24 illustrates example ROM codes outputted.

The data computing section 31 comprises a data calculator 34, console display 35, a line printer 36, a graphic display 37, a CRT 38 and a magnetic tape device 39 that are connected to the data calculator 34. The data calculator 34 has a built-in storage device (not shown) storing a program for generating direct-draw data. The data calculator 34 comprises binary code generating means, coordinates calculating means, data converting means, and pattern data calculating means. The built-in storage device also has a graphic data storage portion that stores direct-draw data (graphic data) for disconnection of aluminum lines. An illustrative image of direct-draw data is shown in FIG. 23. A pattern 61 is determined by direct-draw data so that a shaded portion 62 will be exposed to an electron beam.

The control section 32 comprises a control calculator 40 connected to the data calculator 34, and a deflecting circuit 41, a blanking circuit 42 and a table controller 43 that are connected to the control calculator 40.

The electron-beam patterning section 33 comprises blanking electrodes 44, deflecting electrodes 45, a laser interferometer 46, an X-axis table 47, a Y-axis table 48, an X-axis motor 49, and a Y-axis motor 50. The control section 32 and the electron-beam patterning section 33 constitute electron-beam patterning means.

The blanking circuit 42 receives pattern data via the control calculator 40 and, based on the pattern data, outputs a signal to the blanking electrodes 44 synchronously with the operation of the deflecting circuit 41. The signal causes the blanking electrodes 44 to accordingly blank an electron beam 51, thus performing on/off control of the electron beam irradiation of the wafer 3. The wafer 3 is moved along the X and Y-axes by the X-axis and Y-axis tables 47, 48 that are driven by the X-axis and Y-axis motors 49, 50, respectively. The X-axis and Y-axis motors 49, 50 are controlled by the table controller 43.

The table controller 43 receives data regarding the positions of the X-axis and Y-axis tables 47, 48 from the control calculator 40. The position data for the tables 47, 48 are based on high precision measurements provided by the laser interferometer 46. The position data are also output to the defecting circuit 46. Therefore, high precision patterning can be performed on the wafer 3 by synchronizing, for example, deflection of the electron beam 51 in the direction of the X-axis and sliding of the Y-axis table 48.

Figure 22:
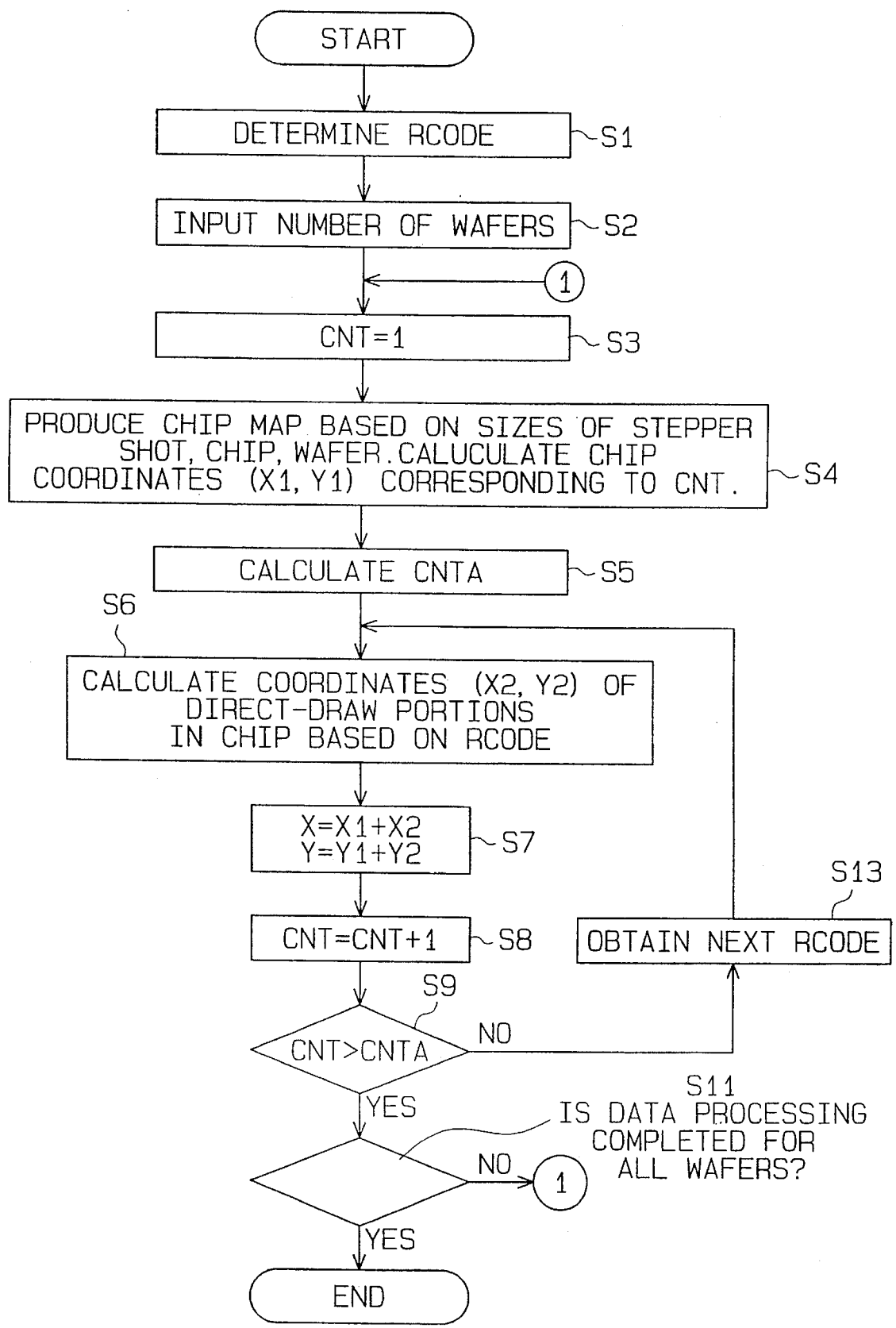
FIG. 22 is a flowchart of operation for generating data for direct patterning on ROM.

The operation of the nonvolatile memory producing apparatus 30 will be described with reference to the flowchart of FIG. 22.

While executing the program for generating direct-draw data, the data calculator 34 determines ROM binary codes RCODE specifically for the individual chips 4 in a wafer 3 in Step S1 so that the ROM code assigned to any one of the chips 4 is different from the ROM code assigned to any other chip 4. The function performed in Step S1 corresponds to the function of the binary code generating means of the data calculator 34. ROM codes may be automatically determined by a permutation scheme or by using a random number generator. According to this embodiment, the binary code generating function provided by the binary code generating means is pre-set so that no single ROM code is generated more than once.

Figure 19:
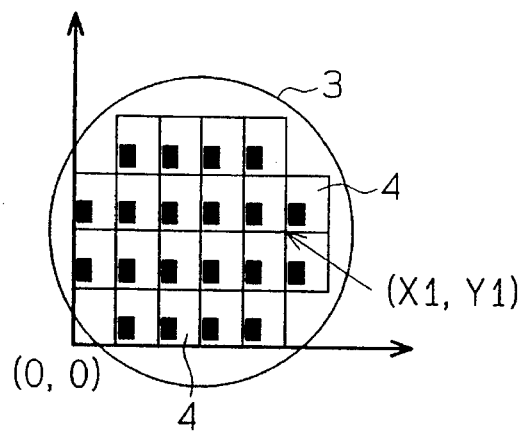
FIG. 19 illustrates chip coordinates on a wafer.

Next the number of wafers used is inputted through an input device (not shown) in Step S2. A counter CNT for the number of chips is set (initialized) to "1" in Step S3. In step S4 a map of chips that are obtainable from a wafer is produced based on the sizes of a stepper shot, chips and wafers, as shown in FIG. 19. The coordinates of each chip 4 (more specifically, the coordinates of the lower left corner of the chip) are also calculated in Step S4 under the conditions where the origin (0, 0) is determined as shown in FIG. 19. The determined coordinates of each chip 4 are named as (X1, Y1). The operations associated with Step S4 are carried out by the coordinates calculating means of the data calculator 34.

Figure 20:
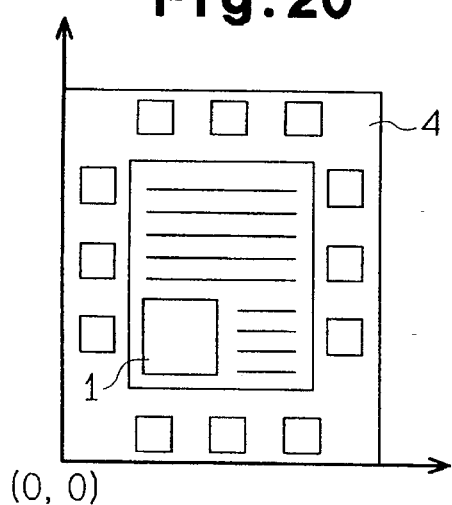
FIG. 20 illustrates a chip at the origin of the coordinate.
Figure 21:
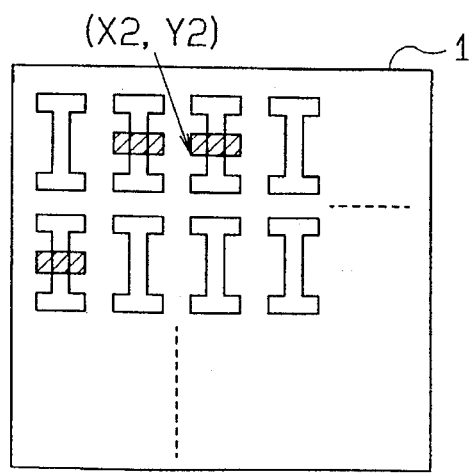
FIG. 21 illustrates direct patterning on ROM.

In Step S5 the number of chips 4 obtainable from the wafer 3 (CNTA) is calculated. In-accordance with the ROM code RCODE assigned to each chip 4 in Step S1, in Step S6, the data calculator 34 calculates the coordinates (X2, Y2) of each direct-draw portion (disconnection portion) in the ROM, that is, a part of direct-draw data (graphic data), in a coordinate system where the origin (0, 0) is determined on the lower left corner of the chip 4 as shown in FIG. 20. Referring to FIG. 21, the shaded portion indicates a direct-draw portion, and the coordinate point (X2, Y2) is determined on the lower left corner of each direct-draw portion. Although FIG. 21 indicates a plurality of direct-draw portions (shaded portions) in a ROM, the number of direct-draw portions in a ROM can vary from zero to many.

In Step S7, the operations: X=X1+X2, Y=Y1+Y2 are performed to obtain the coordinates of direct-draw portions of each chip 4 (or ROM) in the coordinate system on the wafer 3 determined as shown in FIG. 19. The functions performed in Steps S4, S6 and S7 correspond the functions performed by the coordinates calculating means of the data calculator 34. The data including the coordinates can, for example, be arranged as shown in FIG. 24. FIG. 24 illustrates examples of ROM codes and coordinates produced. In FIG. 24, reference numeral 55 denotes an instruction code to put the name of the next block of data (#BLKN); 56 denotes the name of the block of data (EBBLOCK indicating herein a block of direct-draw data, that is, graphic data); 57 denotes an instruction code to provide the coordinates and the orientation of the block (*); 58 denotes the X coordinate for placing the block (e.g., 1020); 59 denotes the Y coordinate for placing the block (e.g., 226); and 60 denotes the orientation for placing the block (e.g., 1).

The data calculator 34 generates direct ROM write data based on the coordinates of the direct-draw portions and the direct-draw data (graphic data) stored in the graphic data storage portion of the storage device, in order to convert data to direct-draw data for each IC chip (or ROM). The data converting means of the data calculator 34 performs this function. The data calculator 34 converts the direct ROM write data to pattern -data for direct patterning by the electron-beam pattering section 33. The pattern data calculation means of the data calculator 34 performs this function. The data calculator 34 temporarily saves the pattern data in a storage device such as the magnetic tape device 39, according to this embodiment. However, generation of the pattern data for a wafer may be immediately followed by direct patterning of the wafer by the electron-beam patterning section 33 without saving the data in a storage device.

In Step S8, the chip count CNT is increased by 1. Then, in Step S9, the apparatus 30 determines whether the number of the counter CNT is larger than the number CNTA of chips obtainable from the wafer 3. If the number of the counter CNT is not larger than the number CNTA of chips, the operation of the apparatus 30 proceeds to Step S13, where the next ROM code RCODE is obtained. That is, the next RCODE is obtained from the RCODEs previously generated in Step S1. Step S13 is followed by Step S6. If it is determined in Step S9 that the number of the counter CNT is larger than the number CNTA of chips, Step 11 determines whether processing for all the wafers has been completed. If it is determined that there is any wafer left to be processed, the operation of the apparatus 30 returns to Step S3 to process the next wafer 3. If it is determined that processing for all the wafers has been completed, the program is ended.

After the program is ended, the control calculator 40 reads pattern data from the storage device, such as the magnetic tape device 39, in the unit of the pattern data covering the entire wafer or a predetermined area of the wafer at a time. Based on the pattern data corresponding to individual chips, the electron-beam patterning section 33 performs direct patterning on the IC chips on the wafer.

This embodiment can assign ROM binary codes to the chips in a wafer on a one-to-one correspondence. That is, the ROM binary code assigned to any one of the chips is different from the ROM code of any other chip in the wafer. This one-to-one assignment of ROM binary codes is achieved simply by disconnecting the aluminum lines in the ROM (CMOS device, FIG. 2) of each chip by an electron beam in accordance with the ROM binary code assigned to the chip. Although, this embodiment requires the addition of this one step of disconnecting aluminum lines to the conventional production steps, the number of steps required by this embodiment is still much less than that required for producing PROMs.

Naturally, this embodiment can assign a ROM binary code to each chip that is different from the ROM binary code of any other chip not only with respect to a single wafer, but also with respect to a plurality of wafers, thus enabling assignment of a great number of different ROM binary codes. For example, ROM binary codes of 20 bits can be easily employed to provide over a million unique codes as the key codes for wireless door lock systems.

Furthermore, this embodiment does not require the use of a mask for the patterning of ROMs. Unlike PROMs, ROMs according to this embodiment are directly written in at the hardware level, thereby substantially eliminating the possibility of data depletion or data mutation. The production process according this embodiment is shorter than that of PROMs. Thus, when compared with PROMs, this embodiment reduces the production costs, enhance the reliability, and shorten the lead time for delivery.

As stated above, the IC chips 4 produced by the apparatus and method of the present invention can be used in vehicle wireless door lock systems as shown in FIG. 31. The wireless door lock system will be briefly described.

Other embodiments of the present invention will be described with reference to FIGS. 25 to 30. Components comparable to those in the first embodiment will be denoted by comparable numerals and will not be described again.

Figure 25:
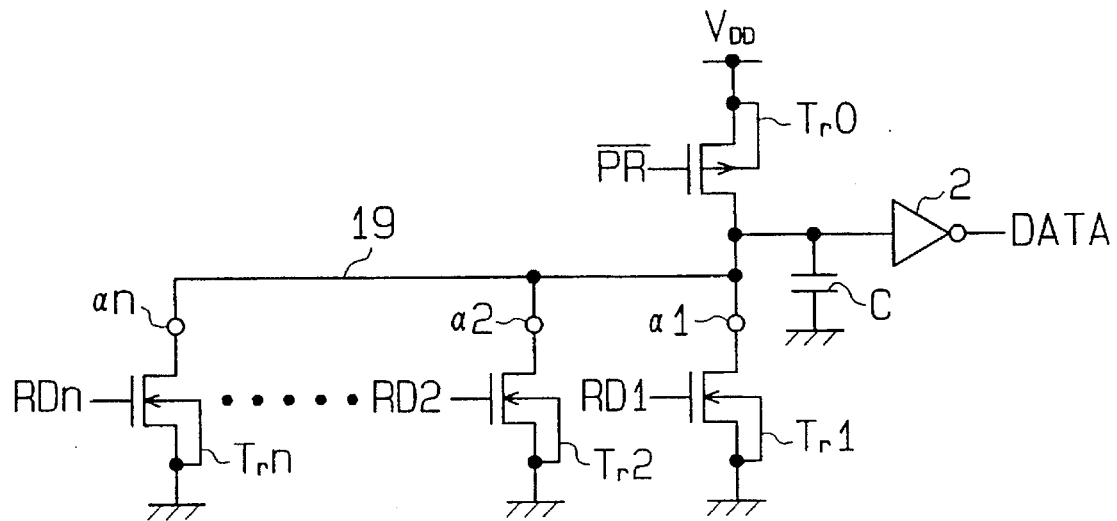
FIG. 25 is a circuit diagram of another embodiment of the invention.

The second embodiment provides for NOR type ROMs as shown in FIG. 25. This embodiment is different from the first embodiment in that a single precharge p-n-p MOS transistor Tr0 is connected to a plurality of n-p-n MOS transistors Tr1, Tr2, . . . Trn in parallel. According to the second embodiment, aluminum lines 19 are disconnected at any one or more of points $\alpha 1-\alpha n$ by electron-beam direct scanning and the subsequent etching. Thus, this embodiment is suitable to produce ROMs having many bits in order to increase the degree of integration.

Figure 26:
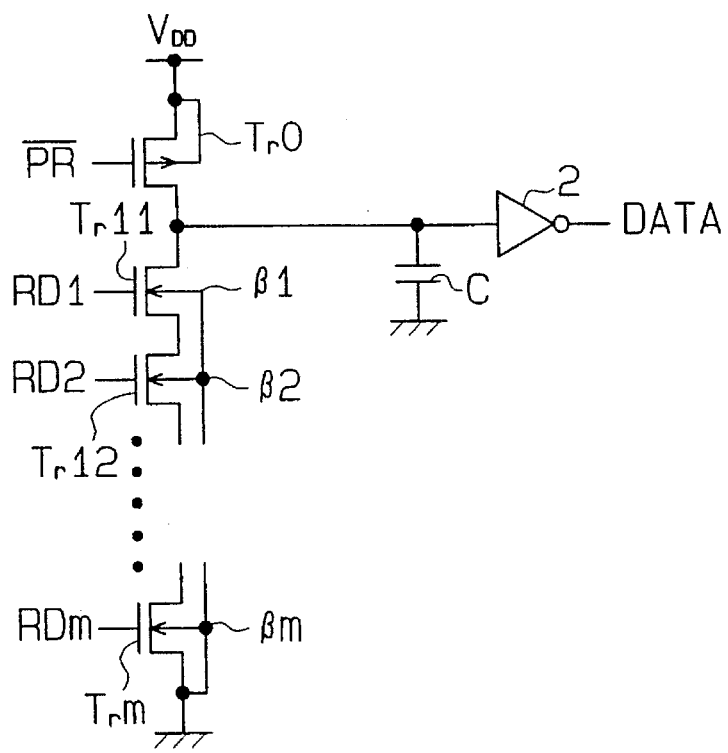
FIG. 26 is a circuit diagram of still another embodiment of the invention.

The third embodiment provides for NAND type mask ROMs as shown in FIG. 26. This embodiment is different from the first embodiment in that a single p-n-p MOS transistor Tr0 is connected to a plurality of n-p-n MOS transistors Tr1, Tr2, . . . Trm in series. According to the third embodiment, ions are implanted in the gate regions of one or more of the n-p-n MOS transistors Tr1, Tr2, . . . Trm to convert the enhancement type transistors to the depletion type. By creating at least one depletion type n-p-n MOS transistor, the threshold voltage is turned to a negative range.

Figure 27:
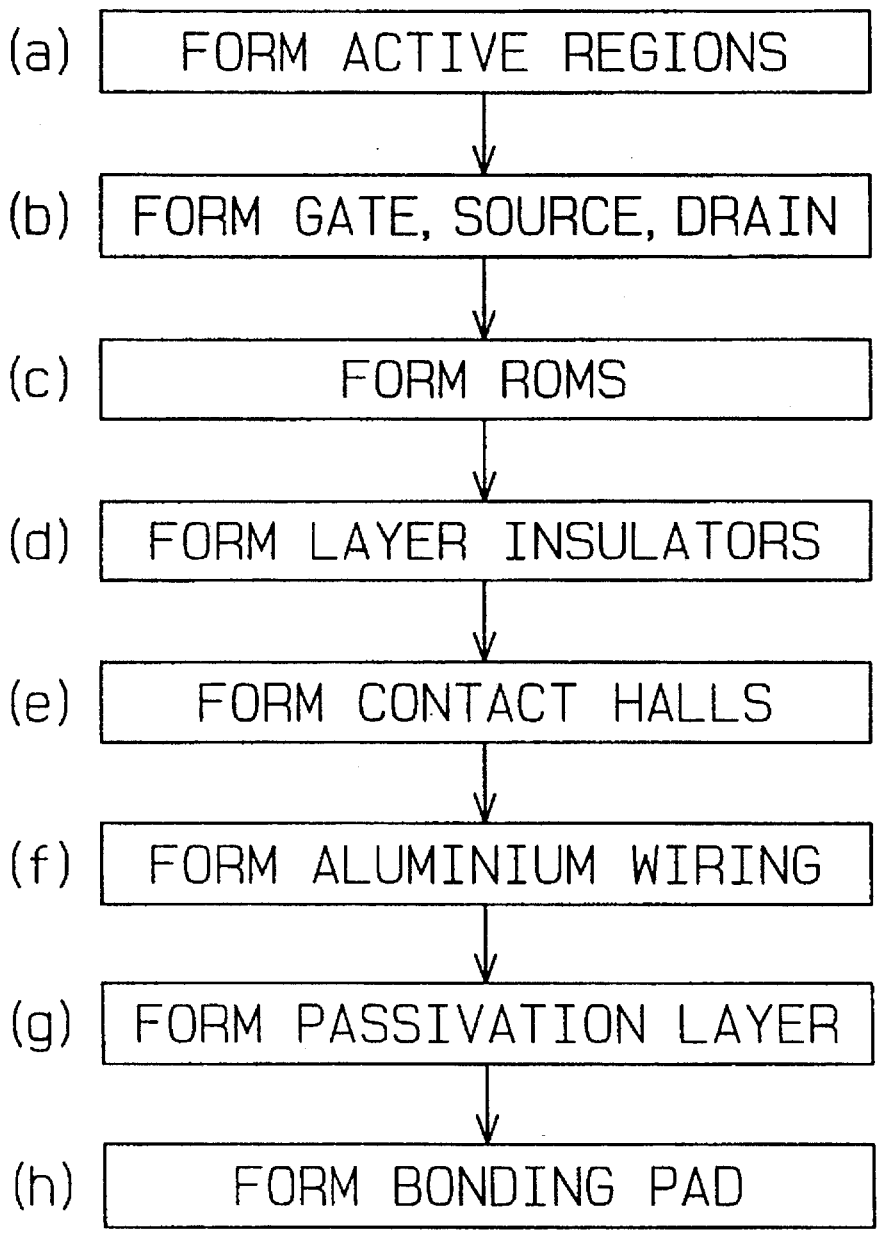
FIG. 27 is a process chart of the formation of CMOS according to a further embodiment of the invention.

The production process according to the third embodiment is different from the production process according to the first embodiment shown in FIG. 8 in that a step of forming ROMs is added between the gate/source/drain forming step and the layer insulator forming step and that the aluminum wiring disconnecting step is omitted as shown in FIG. 27.

Figure 29:
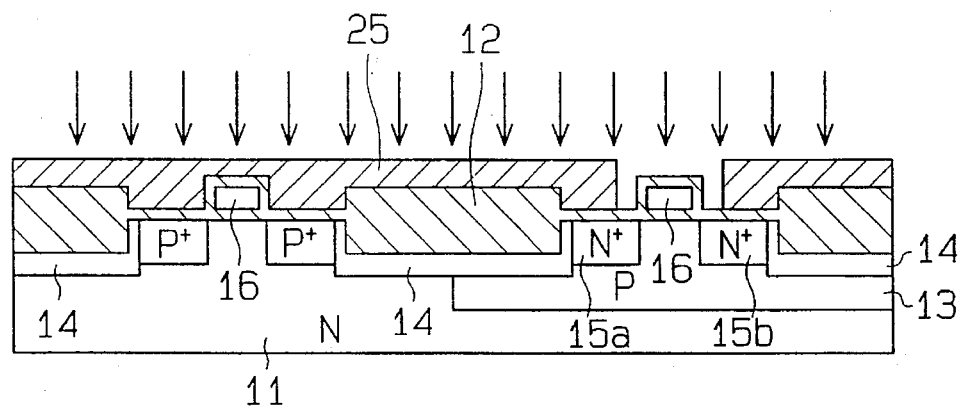
FIG. 29 is a sectional view of the wafer main portions when ion beams are applied to ROM.
Figure 30:
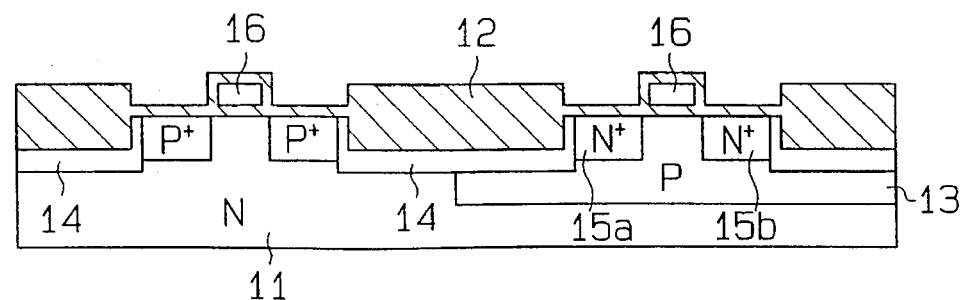
FIG. 30 is a sectional view of the wafer main portions when the photoresist is removed.

The ROM formation process according to the third embodiment will be described with reference to FIGS. 28–30.

Figure 28:
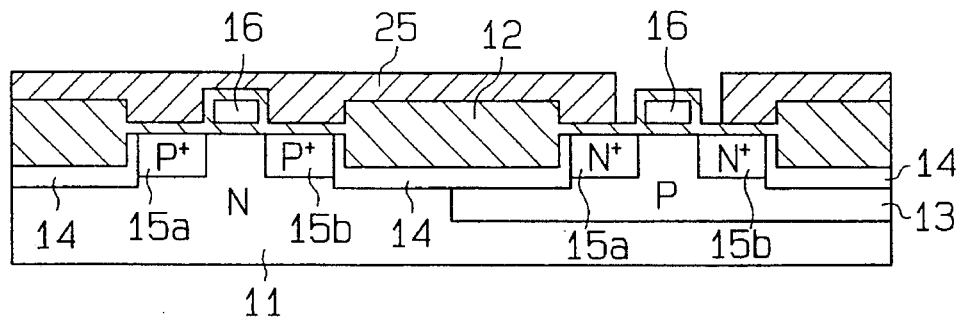
FIG. 28 is a sectional view of main portions of a wafer when a photoresist is fixed on ROM.

Referring to FIG. 28, an electron-beam resist 25 is formed after gates, sources and drains have been formed. Then, the electron-beam patterning section 32 of the nonvolatile memory producing apparatus 30 directly draws patterns predetermined according to the ROM codes specifically assigned to the individual chips, in the resist 25 over the gate regions of the n-p-n MOS transistors. The subsequent development and post-baking step completes formation of halls in the resist 25 over the gate regions of the n-p-n MOS transistors corresponding to the ROM codes. Ion implantation is then performed as shown in FIG. 29 to implant P ions through the halls up to a moderate concentration. The resist 25 is then removed as shown in FIG. 30. More specifically, any one or more of the gate regions $\beta 1-\beta m$ shown in FIG. 26 are subjected to ion implantation so that the corresponding n-p-n MOS transistors are converted to the depletion type. The other n-p-n MOS transistors remain as the enhancement type.

According to the third embodiment, even if there are two or more n-p-n MOS transistors in a ROM, the bit (1 or 0) of an n-p-n MOS transistor can be determined by the presence (or absence) of current when all the other n-p-n MOS transistors are turned on. Thus, this embodiment performs the direct ROM writing by ion implantation, not by disconnection of aluminum wiring using an electron beam.

According to the third embodiment, since source and drain regions can be shared by neighboring n-p-n MOS transistors, the inter-transistor areas can be reduced to further increase the degree of integration.

Although the present invention has been described with reference to what are presently considered to be the preferred embodiments, it should be apparent to those skilled in the art that the present invention can be embodied in many other forms without departing from the spirit or scope of invention. Particularly, it should be understood that the invention may be embodied in the following manners. A. Although the first embodiment determines ROM codes in such a manner that no single ROM code is assigned to two or more ROMs, ROM codes may be determined in such a manner that a single ROM code is assigned to a few ROMs. B. Although the first embodiment disconnects aluminum lines at a point indicated by arrow a in FIG. 4, the disconnection may be achieved in other locations. For example, the disconnection may be achieved between the source or drain and a portion of the aluminum line at the contact hall 18 (a portion indicated by arrow b or c in FIG. 4). C. Although the above embodiments are provided in conjunction with CMOS transistors or mask ROMs, the invention can be embodied in conjunction with bipolar transistors. D. Although the above embodiments assign ROM binary codes to the ROMs of IC chips in a single wafer on the one-to-one correspondence, each ROM binary code may be assigned to two or more IC chips. Further, some of the IC chips in a wafer may be assigned with the same ROM binary code or codes, while other IC chips may be assigned with ROM binary codes on a one-to-one correspondence. E. Although the data calculator 34 according to the first embodiment comprises binary code generating means, coordinates calculating means, data converting means and pattern data calculating means, a plurality of computing devices or other circuitry may be provided to implement these means.

Thus, the embodiments and examples presented herein are to be considered as illustrative and not restrictive. The present invention is not to be limited to the details given herein but may be modified within the scope of the appended claims.

What is claimed is:

1. A method for fabricating read only memory, said method comprises:
    (a) providing a substrate having wells of first doping type and channel stoppers;
    (b) forming active regions in the substrate;
    (c) placing an insulator layer over the active regions;
    (d) forming contact halls through the insulator layer;
    (e) forming metal traces on the insulator layer and in the contact halls;
    (f) removing a disconnection pattern in the metal traces to encode one or more binary codes into the read only memory during fabrication; and (g) placing a passivation layer over the metal traces.

2. A method according to claim 1, wherein said forming (e) metal traces comprises:
- (e1) depositing a layer of metal film over the insulator layer;
- (e2) etching off a portion of the metal film, the remaining portion of the metal film corresponding to the metal traces.

3. A method according to claim 2, wherein said forming (e) metal traces further comprises:
- (e3) making one or more reference marks for subsequent positioning of the disconnection pattern relative to the metal traces.

4. A method according to claim 2, wherein said removing (f) comprises:
- (f1) forming a resist over the metal traces;
- (f2) forming the disconnection pattern in the resist; and
- (f3) etching out disconnections in certain of the metal traces using the disconnection pattern formed in the resist.

5. A method according to claim 1, wherein the read only memory is for use as a code storage memory in a key unit of a wireless door lock system.

6. A method according to claim 5, wherein the binary codes are key codes for the wireless door lock system.

7. A method according to claim 1, wherein said method fabricates the read only memory including chips on individual wafers, and
wherein said removing (f) comprises:
- (f1) generating different binary codes corresponding to each chip;
- (f2) calculating coordinate corresponding to positions of the chips on each wafer;
- (f3) converting the binary codes to direct draw data that is used to write the binary codes on the chips of each wafer; and
- (f4) directly writing the binary codes on the chips of each wafer based on the coordinate calculated and the direct draw data produced.

8. A method for fabricating read only memory including chips on individual wafers, said method comprises:
- (a) providing a substrate having wells of a first doping type and channel stoppers;
- (b) forming active regions in a substrate of each wafer;
- (c) placing a resist on the upper surface of the substrate;
- (d) removing portions of the resist over certain of the chips of each wafer so as to produce openings in the resist in accordance with one or more binary codes;
- (e) ion implanting the substrate through the openings so as to directly write the binary codes to the chips of each wafer;
- (f) removing the remaining portions of the resist;
- (g) plating an insulator layer over the active regions;
- (h) forming contact halls through the insulator layer;
- (i) forming metal traces on the insulator layer and in the contact halls; and
- (j) placing a passivation layer over the metal traces.

9. A method according to claim 8, wherein said removing (d) removes portions of the resist over certain of the gates of the active regions.

10. A method according to claim 8, wherein the read only memory is for use as a code storage memory in a key unit of a wireless door lock system.

11. A method according to claim 10, wherein the binary codes are key codes for the wireless door lock system.

* * * * *